(12) United States Patent
Peace

(10) Patent No.: US 6,494,984 B2
(45) Date of Patent: *Dec. 17, 2002

(54) FLAT MEDIA PROCESSING MACHINE

(75) Inventor: Steven L. Peace, Whitefish, MT (US)

(73) Assignee: Semitool, Inc., Kalispell, MT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/231,194

(22) Filed: Jan. 14, 1999

(65) Prior Publication Data

US 2001/0050061 A1 Dec. 13, 2001

(51) Int. Cl.[7] .......................................... H01L 21/3065
(52) U.S. Cl. ...................................................... 156/345
(58) Field of Search .................. 156/345; 451/283–289, 451/398; 269/21; 118/715, 720, 728, 729; 438/745, 750

(56) References Cited

U.S. PATENT DOCUMENTS

| 5,156,174 | A |   | 10/1992 | Thompson et al. | .......... 134/153 |
| 5,168,886 | A |   | 12/1992 | Thompson et al. | .......... 134/153 |
| 5,168,887 | A |   | 12/1992 | Thompson et al. | .......... 134/153 |
| 5,232,511 | A |   | 8/1993 | Bergman | ........................ 134/2 |
| 5,235,995 | A |   | 8/1993 | Bergman et al. | ............. 134/105 |
| 5,271,796 | A | * | 12/1993 | Miyashita et al. | ........... 156/345 |
| 5,458,724 | A | * | 10/1995 | Syverson et al. | ............. 156/345 |
| 5,532,903 | A | * | 7/1996 | Kendall | ........................ 361/234 |
| 5,624,299 | A | * | 4/1997 | Shendon | ........................ 451/28 |
| 5,738,165 | A | * | 4/1998 | Imai | ........................... 165/80.2 |
| 5,762,751 | A |   | 6/1998 | Bleck et al. | ................. 156/345 |
| 5,795,215 | A | * | 8/1998 | Guthrie | ........................ 451/286 |
| 6,277,014 | B1 | * | 8/2001 | Chen et al. | .................... 45/398 |

FOREIGN PATENT DOCUMENTS

WO   WO 97/07532   2/1997

OTHER PUBLICATIONS

Brochure—EQUINOX—Breakthrough performance in HF vapor processing—Semitool, EQU 1001–9/93, 6 pages.
Brochure—EQUINOX—HF Vapor Cleaning System—Semitool, EQU 1050–9/95. 2 pages.
Brochure—EQUINOX—Metal Etch System—Semitool, EQU 1053 9/95—2 pages.

* cited by examiner

Primary Examiner—Benjamin L. Utech
Assistant Examiner—Lan Vinh
(74) Attorney, Agent, or Firm—Perkins Coie LLP

(57) ABSTRACT

A machine for processing the front side of a flat media workpiece, such as a silicon wafer, seals the backside of the wafer from processing chemicals. A rotor has an inside ring and an outside ring protruding from the rotor face. The inside ring and outside ring are separated by an annular groove in the rotor. A O-ring is positioned between the inside ring and the outside ring. A membrane extends from the inside ring, over the annular groove and the O-ring, to the outside ring. The membrane and face of the rotor form a sealable wafer back face chamber between them. Vacuum is applied to the back face chamber to hold the wafer against the membrane. The back surface of the wafer is sealed from processing chemicals, which are allowed to contact only the front surface and edges of the wafer.

22 Claims, 9 Drawing Sheets

FLAT MEDIA PROCESSING MACHINE

The field of the invention is machines for processing flat media, such as semiconductor wafers, substrates, flat panel displays, photomasks, data disks and similar articles.

BACKGROUND OF THE INVENTION

In the processing of various flat media, including semiconductor wafers, it is frequently necessary to expose a surface of the flat media (referred to herein as wafers) to processing chemicals, such as various reactants, coatings, or solvents, which may be in either liquid or gas phase. For certain operations, the processing is required only on the front side of the wafer. In these operations, it is advantageous to seal the back surface of the wafer from the processing chemicals involved, simply to reduce the quantity of processing chemicals consumed. While exposing the back face of a wafer to processing chemicals may, in certain instances be irrelevant to the final semiconductor product produced, it unnecessarily increases the amount of processing chemicals used. It may also increase the amount of processing waste products, which can be costly to treat or dispose of.

In other semiconductor processing steps, it is important to seal the back face of the wafer or substrate, from the front face being processed, to avoid contamination. For example, in preparing a wafer for growth of the epitaxial layer during the manufacture of semiconductors, all pre-existing oxide must be removed from the front surface of the wafer, typically via etching with aqueous or vaporous hydrogen fluoride. The back surface must be sealed from the hydrogen fluoride to prevent contamination.

In other processes as well, it is important that a particular coating, reactant, processing chemicals, etc. not contact the back side of a wafer, because of contamination effects which can result in subsequent processing.

Existing wafer processing machines use a membrane which seals against the back side of a wafer using vacuum to prevent processing chemicals from contacting the back side. While these types of machines have been successfully used in the past, they have certain disadvantages. A substantial vacuum is required to reliably seal the membrane to the back surface of the wafer. As the wafer is drawn against the membrane, significant bending stresses develop in the wafer and can cause cracks in the wafer. In addition, the membrane in existing machines contacts a significant amount of surface area on the back surface of the wafer. As the areas contacted may be rendered unsuitable for semiconductor devices, it is advantageous to seal the back side of the wafer while touching only a minimum amount of surface area near the extreme outside edges of the wafer. Indeed, future industry standards require that machines for processing semiconductors touch semiconductor wafers only near their edges, a standard difficult or impossible to meet with existing machines.

Thus, there is a need for improved machines and methods for processing flat media, such as semiconductor wafers.

SUMMARY OF THE INVENTION

To these ends, in a first aspect of the invention, a machine for processing flat media includes a rotor having an inside and an outside ring or protrusion. A membrane extends from the inside protrusion to the outside protrusion. A stopping element on the rotor limits the deflection of the membrane and causes the membrane to seal against a small surface area on the back surface of the wafer. As a result, manufacturing efficiency is increased as more area of the wafer remains available to be processed into a semiconductor device.

In a second and separate aspect of the invention, a groove is provided in between the inside and outside protrusions, with the membrane extending across the groove. With vacuum applied to the groove, as well as to the back surface of the wafer, the contact area between the membrane and wafer is minimized, thereby increasing manufacturing efficiency.

In a third and separate aspect of the invention, the stopping element deflects a narrow annular area of the membrane into sealing contact with the back surface of the membrane. Consequently, less vacuum is required for sealing, reducing stress and the potential for cracking the wafer.

In a fourth aspect of the invention two or three of the aspects described above are combined to achieve the advantages described.

Accordingly, it is an object of the invention to provide an improved machine for processing flat media such as semiconductor wafers.

BRIEF DESCRIPTION OF THE DRAWINGS

Other features and advantages will become apparent from the following description taken in connection with the accompanying drawings, which show a single embodiment of the invention. The drawings are provided for illustration only, and are not intended as a statement of the limits of the invention. In the drawings, wherein the same reference number denotes the same element throughout the several views.

DETAILED DESCRIPTION OF THE DRAWINGS

Figure 1:
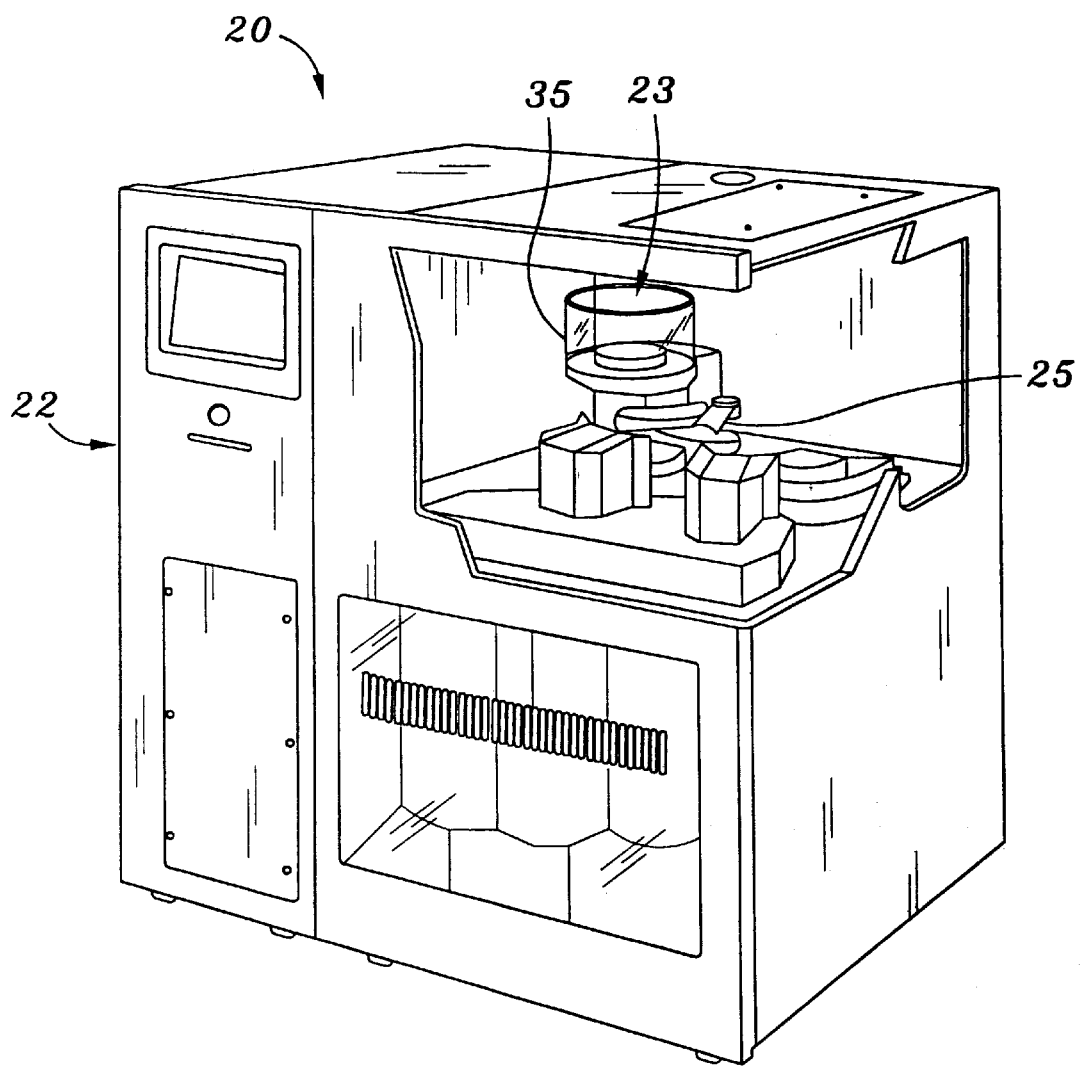
FIG. 1 is a perspective view of the present flat media processing machine.

Turning now in detail to the drawings, as shown in FIG. 1, a machine 20 for processing flat media has an enclosure 22. One or more single wafer processors 23 are provided within the enclosure 22.

Referring to FIGS. 1–4 a support plate 54 is fixed to the enclosure 22, and is sealed within the enclosure 22, via a seal at the perimeter of the support plate. The support plate 54 rotatably supports a processor head 32 within the enclosure. The processor head contains a shift rotor, which shifts vertically up and down, to engage and seal the back surface of a wafer placed into the head 32.

Figure 2:
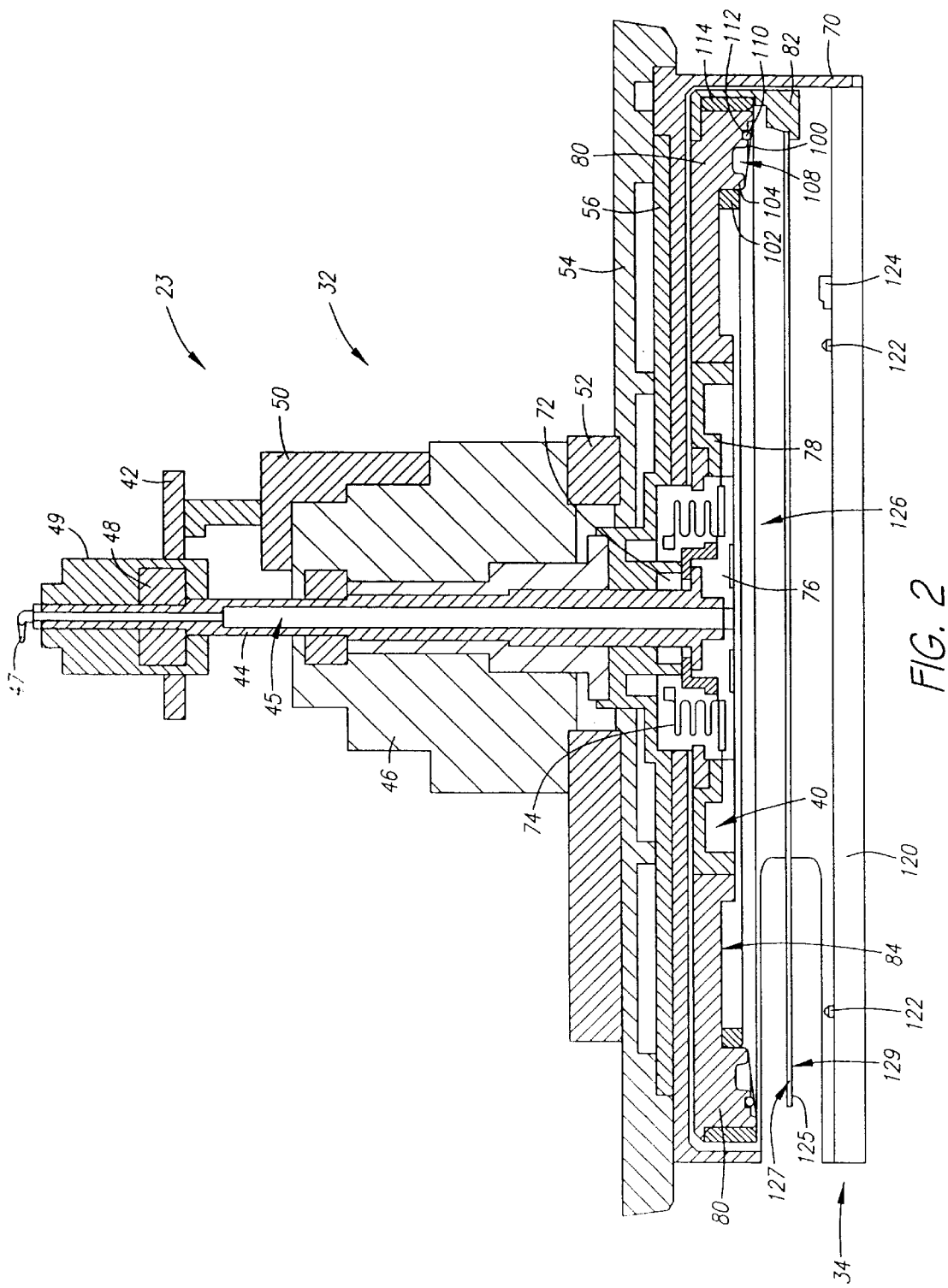
FIG. 2 is a section view of components of the head and base of the machine shown in FIG. 1.
Figure 3:
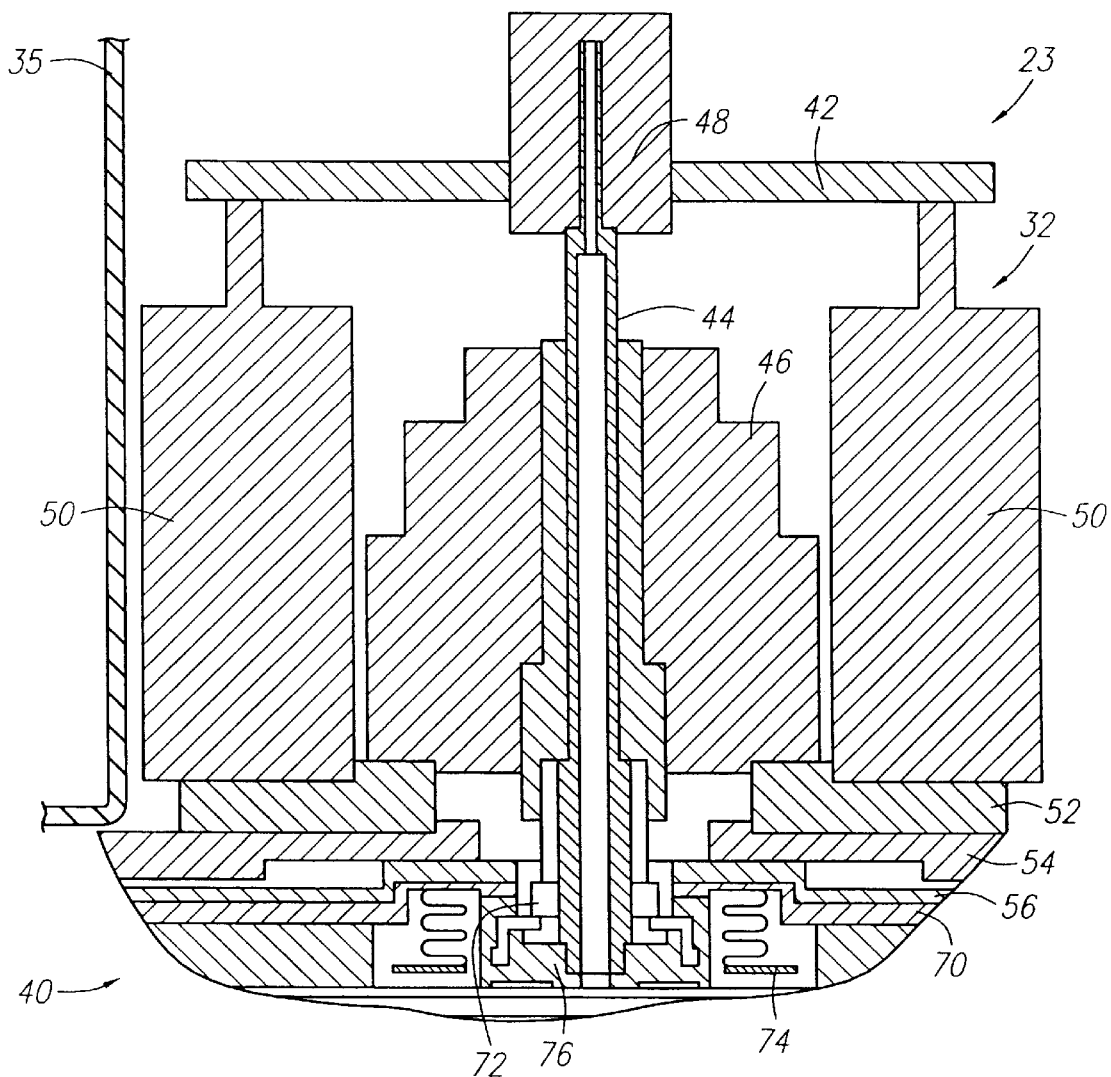
FIG. 3 is an enlarged partial section view thereof illustrating additional details of the head.

As shown in FIGS. 2 and 3, a rotor spin motor 46 is mounted on a motor plate 52 attached to the support plate 54. A shift rotor shaft 44 extends down through the spin motor 46. The upper end of the shaft 44 is held in a bearing 48 on a bearing plate 42. The bearing plate 42 is supported on top of a set of 2 pairs of linear actuators 50. The linear actuators 50, preferably air cylinders, are attached to the motor plate 52.

An air cylinder plate 52 under the motor 46, is attached to the head housing 35. Air cylinders 50 are supported on the air cylinder plate 52 and attached to the bearing plate 42, to vertically shift the bearing plate 42, and correspondingly to shift the rotor shaft 44 vertically. A support plate 54 under the air cylinder plate 52 is fixed to the head housing 35, and surrounds the upper section of a cylindrical rotor housing 70. A rotor plate 56 is positioned between the support plate 54 and the rotor housing 70. The head housing 35 largely encloses the head 32 and is supported on a head elevator (not shown) which raises and lowers the head, as described, e.g., in U.S. Pat. No. 5,762,751, incorporated herein by reference.

A bushing 72 rotatably supports the rotor shaft 44 within the rotor plate 56. The lower section of the shaft 44 is square, so that it can transmit torque, and the inside opening through the bushing 72 is also square, to receive the square shaft section. A bellows 74 is attached to the rotor hub 76 and to the inner diameter of the rotor housing 70, to allow the rotor hub 76 to shift vertically, while maintaining a seal between the spaces above the rotor hub 76 from the spaces below the rotor hub 76. The rotor hub 76 is threaded onto the rotor shaft 44

Figure 4:
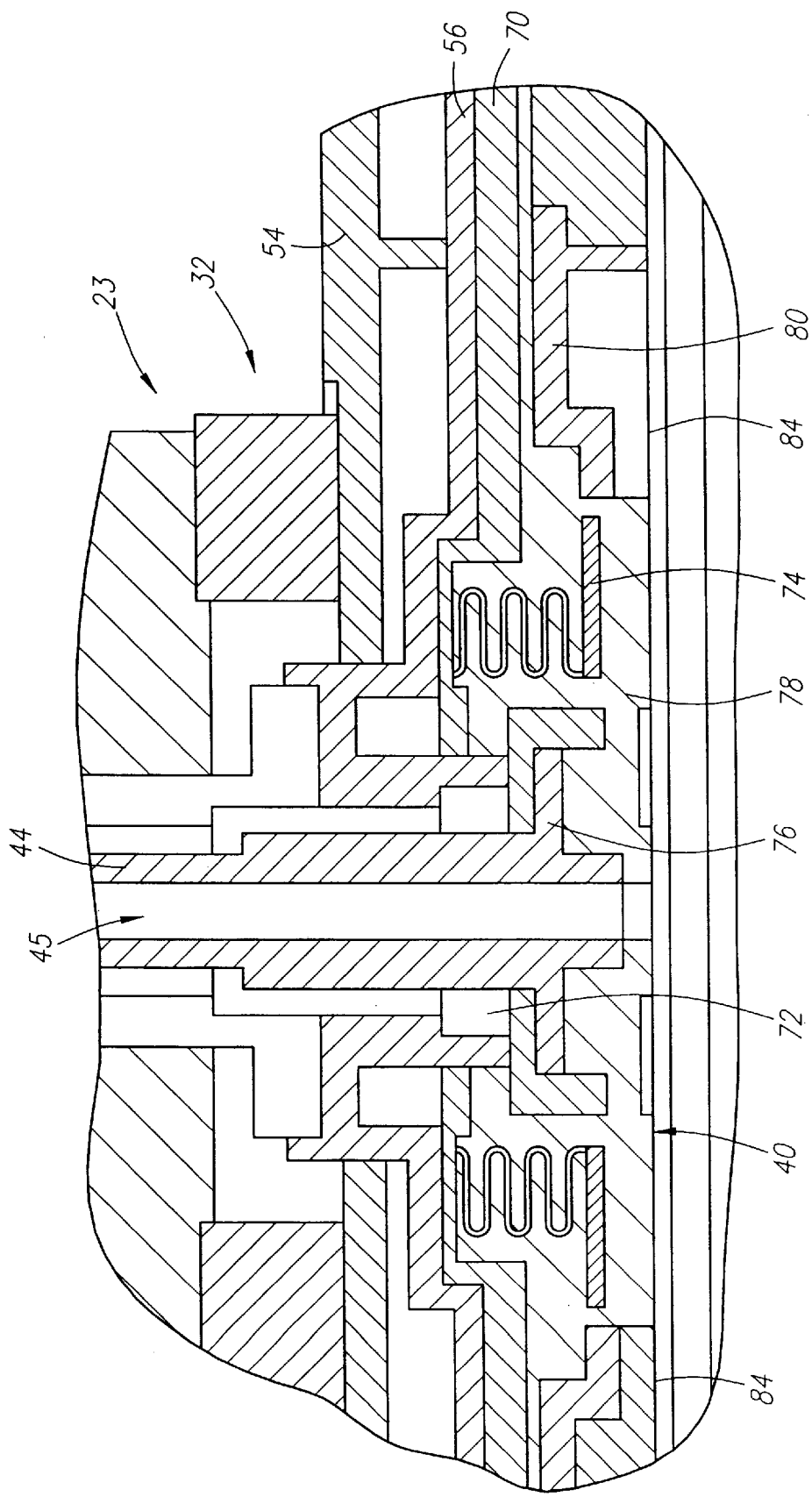
FIG. 4 is a further enlarged section view detail of the head shown in FIGS. 2 and 3.

Referring still to FIGS. 2–4, a mid plate 78 is attached concentrically to the rotor hub 76, and a rotor ring 80 is in turn attached to the mid plate 78. A plurality of guide arms 82 e.g., 3 or 4, extend downwardly from the rotor ring 80 to hold a flat media workpiece 125, such as a wafer. The guide arms are spaced apart around the right side of the rotor ring 80, so that a wafer 125 can be loaded into the head 32 through a slot (at the left side in FIG. 2) in the rotor housing 70.

A wafer chamber or space 126 is formed between the top or back surface 127 of the wafer 125, and the bottom face 84 of the rotor.

The head 32 includes a spinning rotor assembly 40, made up of the rotor shaft 44, the rotor hub 76, the mid plate 78, the rotor ring 80, the guide arms 82, the rotor plate 56, and the rotor housing 70. These components, which collectively form the rotor assembly 40, spin within the head housing 35. The rotor shaft 44 spins within the motor 46 and the bearing 48. The rotor hub 76, mid plate 78, rotor ring 80, and guide arms 82, spin within the cylindrical rotor housing 70. The rotor plate 56 is on top of and spins with the rotor housing 70. The support ring 54, air cylinder plate 52 and motor 46 are fixed and do not spin. The rotor assembly 40 accordingly can rotate, as driven by the spin motor 46, and can also shift vertically, as driven by the air cylinders 50. The rotor ring 80 is keyed to the rotor housing 70 and spins with it. However, the rotor ring 80 and its associated elements shift vertically, whereas the rotor housing does not.

Figure 5:
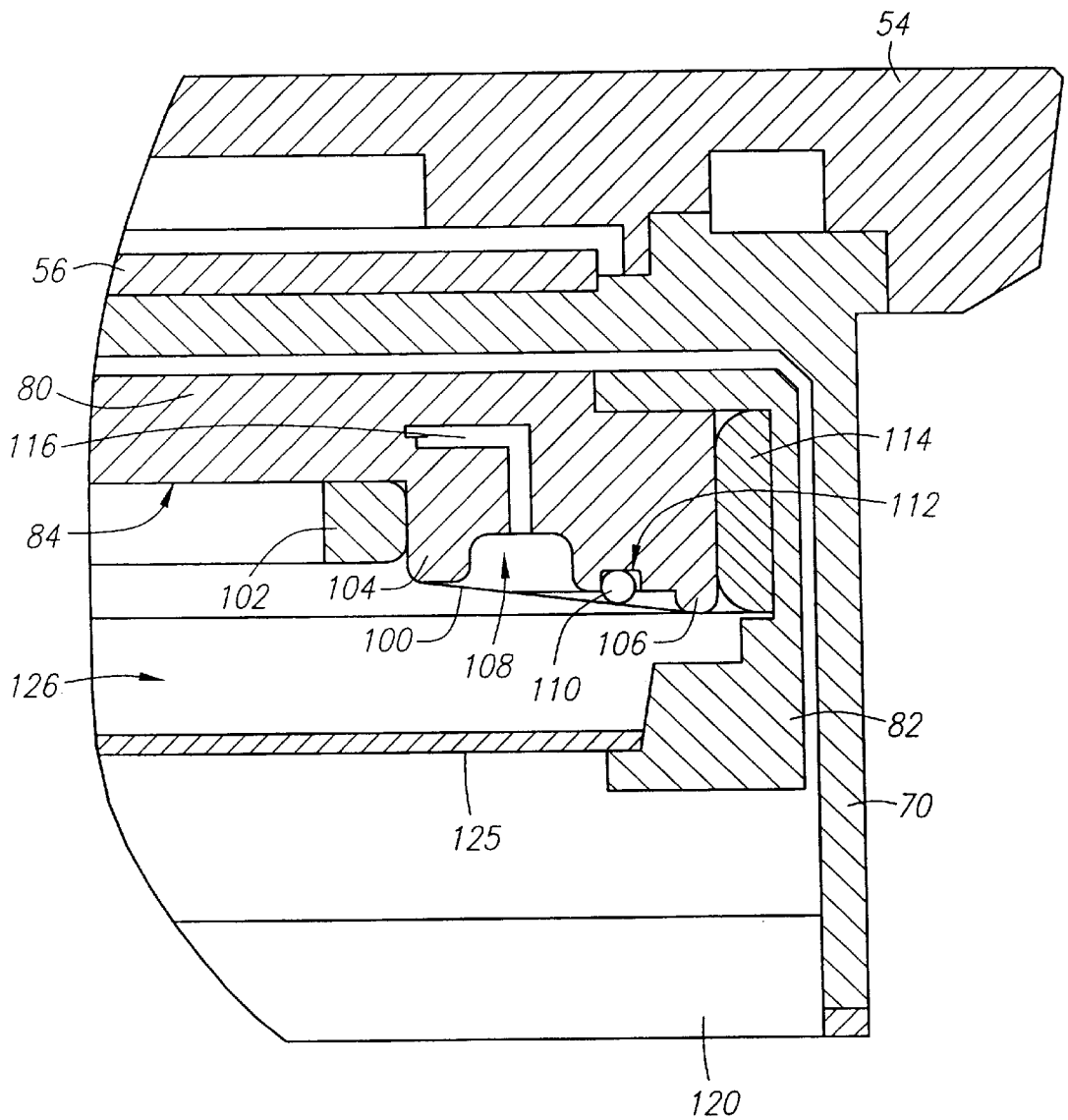
FIG. 5 is an enlarged section view detail of one side of the head showing a wafer in a beginning load position.

Turning now to FIG. 5, an inner ridge or protrusion 104 and an outer ridge or protrusion 106 are spaced apart at the outer section of the rotor ring 80. A groove 108 is formed in the rotor ring 80 in between the inner ridge 104 and the outer ridge 106. A membrane 100 extends from the inner ridge 104 to the outer ridge 106. The membrane, preferably, PTFE, is secured and sealed to the inner ridge 104 via a plastic membrane seal ring 102. Similarly, the membrane 100 is attached and sealed around the outer ridge 106 by an outer membrane ring 114. The annular membrane therefore seals the groove 108 from the wafer chamber or space 126.

A stopping element, preferably a resilient O-ring 110 is positioned within an O-ring groove 112 in the rotor ring 80, between the groove 108 and the outer ridge 106. As shown in FIG. 5, the O-ring is ordinarily separated from the membrane 100 by a small gap, e.g., 0.02 inches.

The groove 108 connects to a vacuum source via a vacuum bore 116 extending from the groove 108 into the wafer chamber space 126. A vacuum source (not shown) within the enclosure 22 or separately provided in the manufacturing facility, is connected to the vacuum port, to provide vacuum to the single wafer processor 23 as needed. The vacuum source draws a vacuum in the wafer chamber 126 and in the groove 108.

Referring to FIGS. 2 and 5, base plate 120 on the base 34 of the single wafer processor 23 includes wafer stand-offs 122, to support the wafer 125, before it is picked up by the rotor assembly 40. Radial guide blocks 124 on the base plate 120 align the wafer 125 so that it is concentric with the rotor assembly 40.

In use, and with reference to FIGS. 1, 2 and 5, a single wafer 125 is moved from a container or storage location 27 with the enclosure 22 onto the base plate 120, via a robot arm 25 or other manipulator. The robot arm 25 moves the wafer 125 through the side opening or slot in the rotor housing 70 and sets the wafer down onto the guide arms 82. At this point the wafer is properly aligned so that it can be subsequently picked up by the rotor assembly 40. The robot arm 25 then releases the wafer 125.

Figure 6:
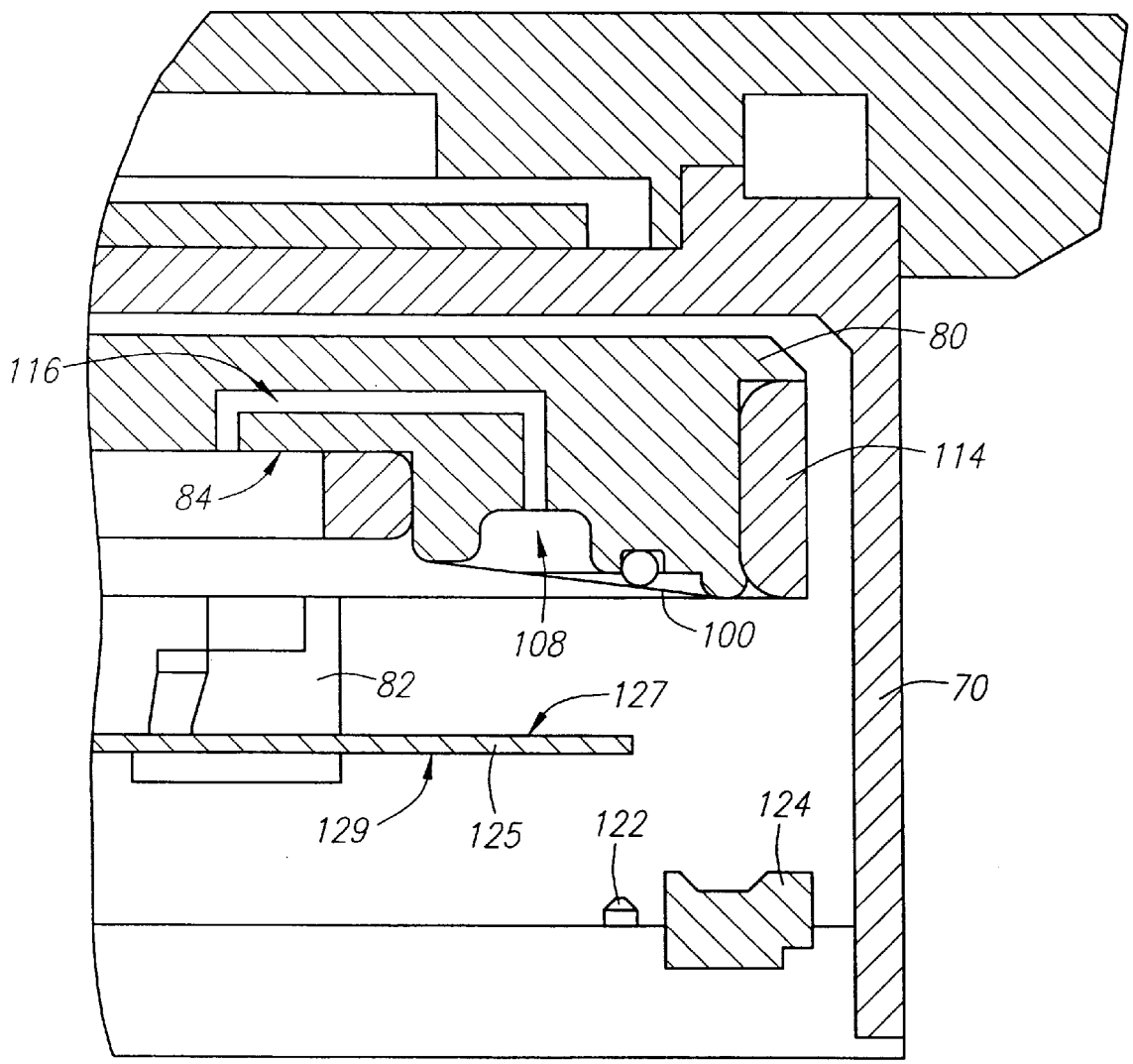
FIG. 6 is a rotated view of the detail of FIG. 5.
Figure 7:
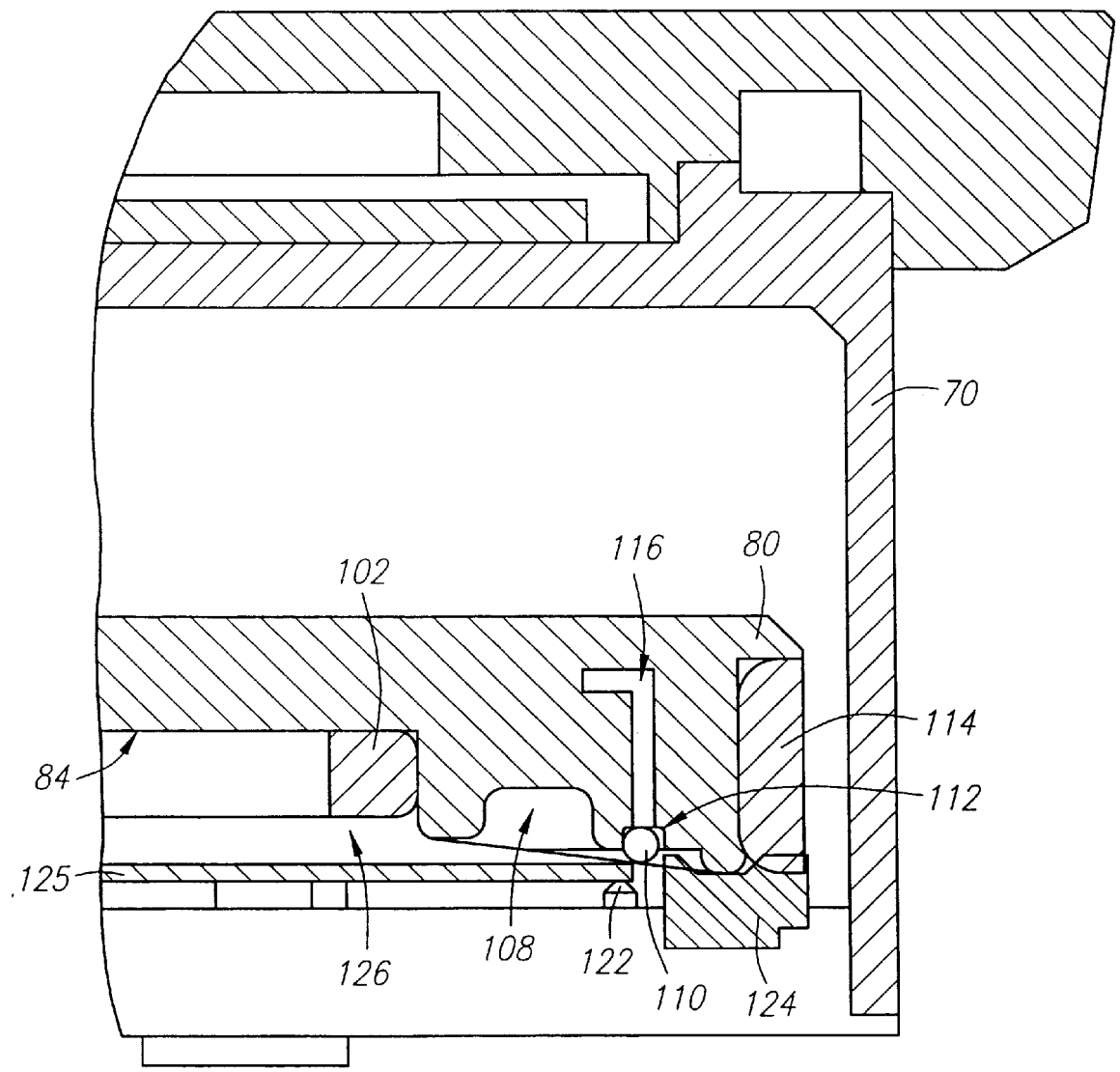
FIG. 7 is an enlarged section view detail of the head showing the wafer in the pick up position.
Figures 10, 11:
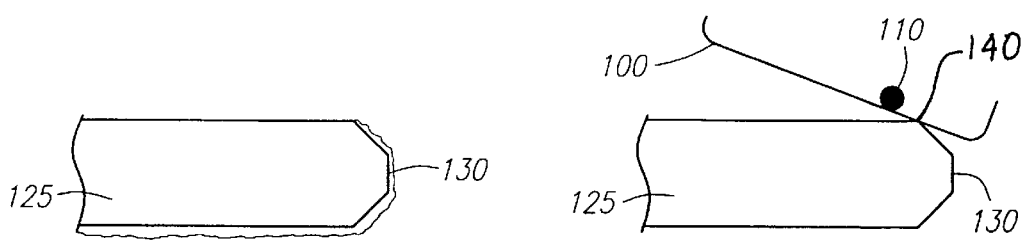
FIG. 10 is an enlarged side view of a wafer showing the surfaces which are etched.
FIG. 11 is an enlarged side view of the membrane and wafer shown in FIG. 7.

Referring to FIGS. 3, 6 and 7, the air cylinders 50 are actuated to extend the rotor assembly 40 downwardly. Referring specifically to FIG. 7, as the rotor assembly 40 moves downwardly, the rotor ring 80 moves towards the lower open end of the cylindrical rotor housing 70. The guide blocks 124 on the base plate help to properly position the wafer. The wafer is transferred from the guide arms 82 to the pins 122 and guided by 124. As the rotor assembly 40 continues to move down, the spring loaded guide blocks 124 are pushed out of the way. The membrane 100 engages the outer edges of the top surface 127 of the wafer 125. The O-ring 110 defines the point of contact between the membrane 100 and the wafer 125. Vacuum is applied to the groove 108 via the wafer chamber 126 and the vacuum bore 116 connecting to the rotor bore 45 connecting to a vacuum source through the vacuum port 47. The membrane is pressed against and seals around the wafer perimeter. The O-ring 100 prevents the wafer 125 from being drawn too far into the membrane. Consequently, the O-ring 110 limits the amount of contact the membrane 100 makes with the wafer 125. As vacuum is applied to both sides of the membrane, i.e., to the wafer chamber 126 and to the groove 108, the membrane remains in a neutral position to minimize contact with the back surface 127 of the wafer 125. As shown in FIG. 11, the seal point 140 is located at the upper edge of the wafer, just to the outside of the O-ring.

Figure 8:
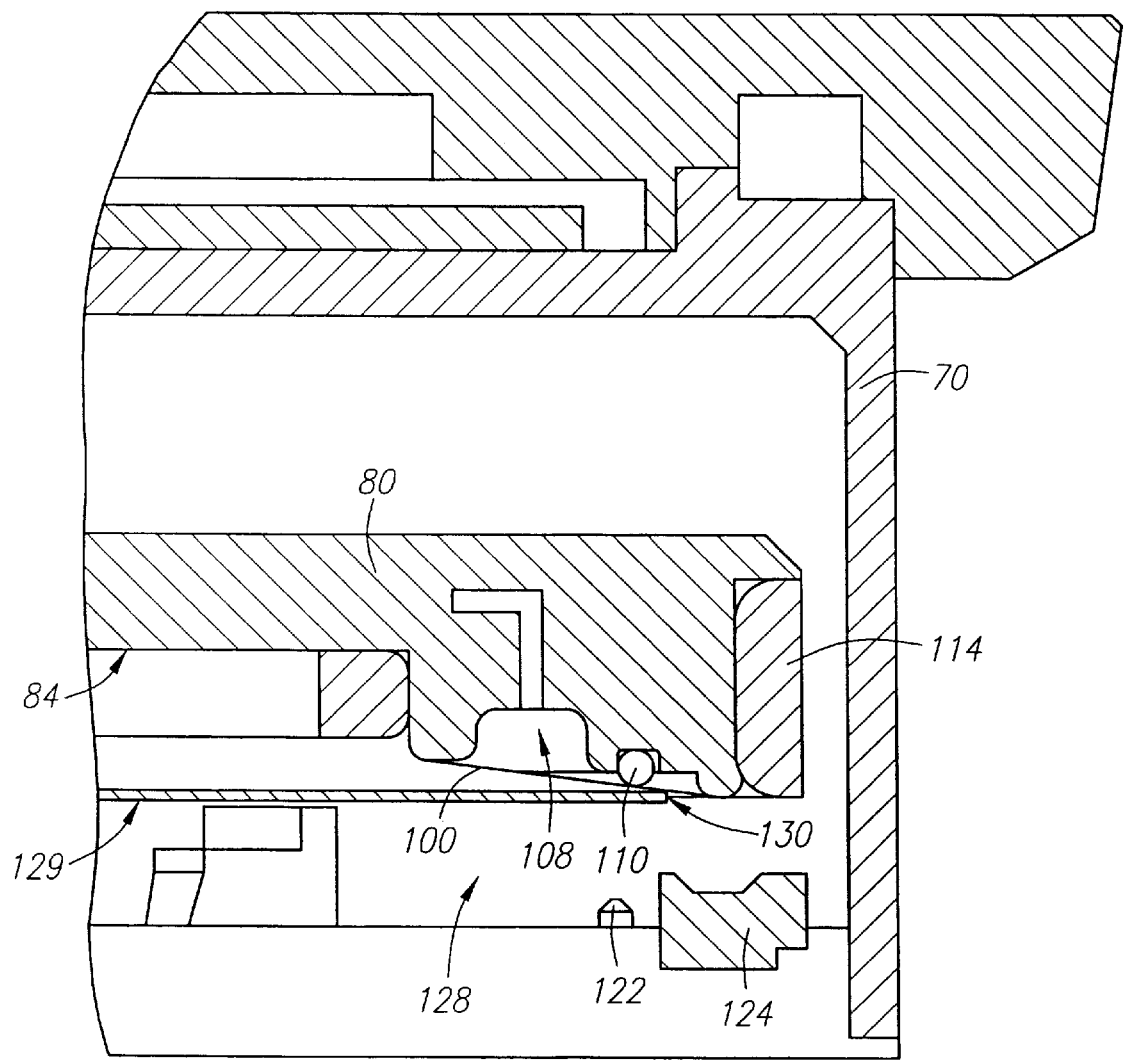
FIG. 8 is an enlarged section view detail of the head showing the wafer in the 1; processing position.

Referring to FIG. 8, processing chemicals, e.g., hydrogen fluoride, are supplied to a vapor chamber 128 formed between the front surface 129 of the wafer 125, and the base plate 120. The processing chemicals contact the entire front surface 129 of the wafer 125, as well as the outside edge 130 of the wafer 125, as shown in FIG. 10. The membrane 100 seals against the back surface 127 of the wafer 125, underneath the O-ring 110, thereby preventing any processing chemicals from reaching the back side 127 of the wafer 125. The vacuum supplied to the groove 108 holds the membrane 100 away from the back surface 127 of the wafer 125, so that the membrane 100 contacts the wafer only under the O-ring 110. As a result, the back surface 127 of the wafer 125 remains largely untouched and uncontaminated during processing.

While the front surface 129 of the wafer 125 is exposed to processing chemicals supplied to the chamber 128, the rotor assembly 40 is preferably rotated via the spin motor 48, typically at from 100–500 rpm. Following this step, high speed rotation may continue to remove condensation from the wafer.

Figure 9:
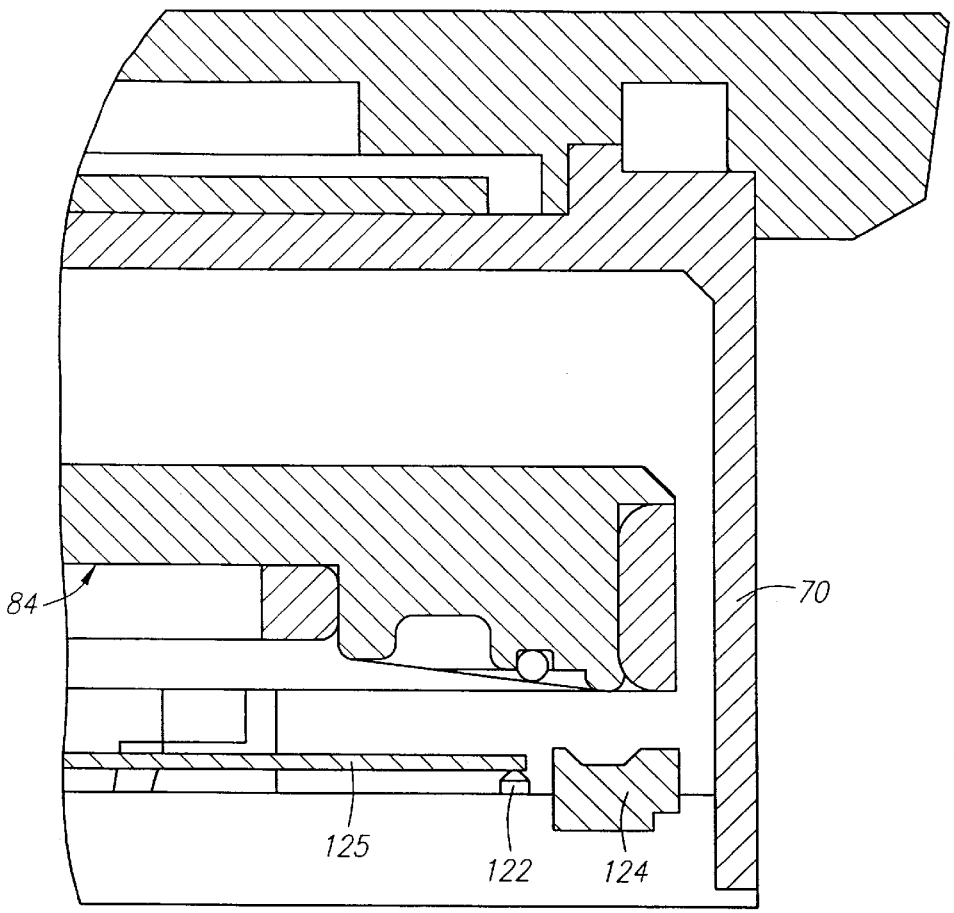
FIG. 9 is an enlarged section view detail of one side of the head showing the wafer in the drying position.

After completion of processing, the rotor assembly 40 once again moves down to place the wafer 125 back on the pins 122. The vacuum in the wafer chamber 126 is cut off, thereby releasing the wafer from the membrane 100. The vacuum in the groove 108 is also then cut off. The rotor assembly 40 is moved up, as shown in FIG. 9. The rotor housing 70 and the rotor assembly 40 spin to help dry the wafer. (All of the elements shown in FIG. 9 are spinning elements). The rotor assembly 40 then retracts or moves up, driven by the linear actuators 50. As this occurs, the guide arms 82 pick or lift up the wafer off of the pins 122. The now processed wafer 125 is then ready for removal from the single wafer processor 23 via the robot arm 25.

Thus, a novel flat media processing machine has been shown and described. Various modifications may of course be made without departing from the spirit and scope of the invention. The invention, therefore, should not be limited, except by the following claims and their equivalents.

I claim:

1. A machine for processing flat media comprising:
   a rotor having an inside protrusion and an adjacent outside protrusion;
   a membrane extending from the inside protrusion to the outside protrusion; and
   a stopping element on the rotor between the inside and outside protrusions for limiting deflection of the membrane.

2. The machine of claim 1 further comprising a sealed enclosure around the rotor and a vacuum source connecting to the sealed enclosure.

3. The machine of claim 1 wherein the membrane is displaceable from a first position wherein the membrane is spaced apart from the stopping element, to a second position, wherein the stopping element contacts and deflects the membrane.

4. The machine of claim 1 wherein the stopping element comprises an O-ring.

5. The machine of claim 4 wherein the O-ring is partially recessed within an O-ring groove in the rotor.

6. The machine of claim 1 further comprising a groove between the inside protrusion and the outside protrusion, and the membrane extends across the groove.

7. The machine of claim 6 further comprising a vacuum source connecting the groove.

8. The machine of claim 6 further comprising a rotor shaft attached to the rotor, with a rotor bore extending through the rotor shaft and connecting to the groove.

9. The machine of claim 1 wherein the flat media is a round wafer having an outer edge and the rotor is adapted to engage the wafer, with the stopping element adjacent to the outer edge of the wafer.

10. The machine of claim 9 further comprising a vacuum source within the rotor for holding a wafer onto the rotor.

11. A machine of claim 10 wherein the stopping element and membrane form a gas-tight seal against the wafer.

12. The machine of claim 11 wherein the wafer has a bevel around its outer perimeter and the membrane seals against the wafer at the bevel.

13. A machine for processing the front side of a round wafer while sealing the back side of the wafer from processing liquids and gases, comprising:
   a rotor having a rotor face and an inside ring and an adjacent outside ring protruding from the rotor face and separated by an annular groove in the rotor;
   an O-ring groove between the inside ring and the outside ring, and with the annular groove between the inside ring and the O-ring groove;
   an O-ring secured into the O-ring groove and extending partially out of the O-ring groove; and
   a membrane extending from the inside ring, over the annular groove and the O-ring, to the outer ring, the membrane and rotor face forming a sealable wafer back face chamber between them.

14. The machine of claim 13 further comprising a vacuum source connecting to the annular groove and to the back face chamber.

15. The machine of claim 14 wherein the membrane does not touch the O-ring until a vacuum is drawn in the wafer back face chamber.

16. A machine for processing a single flat media article, comprising:
   a rotor having an inside protrusion spaced apart from an adjacent outside protrusion;
   a membrane extending across from the inside protrusion to the outside protrusion; and a stopping element on the rotor adjacent to a perimeter of a flat media article engaged by the rotor, with the stopping element limiting deflection of the membrane.

17. A machine for processing flat media, comprising:
   a rotor including a rotor ring and an inner protrusion and an adjacent outer protrusion at the outer section of the rotor ring; and
   a membrane ring disposed about the inner protrusion and the outer protrusion, the diameter of the membrane ring extending from the inner protrusion to the outer protrusion.

18. A machine for processing flat media articles, comprising:
   a rotor engageable to a flat media article and having an inside protrusion and an outside protrusion;
   a membrane extending from the inside protrusion to the outside protrusion; and
   a stopping element on the rotor for limiting deflection of the membrane as the membrane contacts the flat media article.

19. A machine for processing a wafer, comprising:
   a rotor having an inside protrusion and an outside protrusion;
   a membrane extending from the inside protrusion to the outside protrusion; and
   a stopping element on the rotor, for limiting contact between the membrane and a wafer engaged by the rotor, to a contact area between the stopping element and the outside protrusion.

20. The machine of claim 19 further comprising a groove in the rotor between the stopping element and the inside protrusion.

21. A machine for processing a wafer comprising:

a rotor having a rotor ring;

an inner protrusion projecting from the rotor ring by a first dimension;

an outer protrusion projecting from the rotor ring by a second dimension greater than the first dimension;

a membrane extending from the inside protrusion to the outside protrusion; and a stopping member on the rotor ring, between the inside and outside protrusions.

22. The machine of claim 21 where the inside protrusion, the groove, and the outside protrusion are circular and concentric with each other.

* * * * *